(12) United States Patent
Govorkov et al.

(10) Patent No.: US 7,697,207 B2
(45) Date of Patent: Apr. 13, 2010

(54) HIGH POWER AND HIGH BRIGHTNESS DIODE-LASER ARRAY FOR MATERIAL PROCESSING APPLICATIONS

(75) Inventors: Sergei V. Govorkov, Los altos, CA (US); Sol Peter DiJaili, Moraga, CA (US); Douglas William Anthon, El Cerrito, CA (US); Luis A. Spinelli, Sunnyvale, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 12/322,601

(22) Filed: Feb. 4, 2009

(65) Prior Publication Data

US 2009/0190218 A1 Jul. 30, 2009

Related U.S. Application Data

(62) Division of application No. 11/488,578, filed on Jul. 18, 2006, now Pat. No. 7,515,346.

(51) Int. Cl.
*G02B 27/10* (2006.01)
*G02B 27/30* (2006.01)

(52) U.S. Cl. .................. 359/618; 359/619; 359/641; 372/6; 372/34; 372/36; 372/50.12; 372/70; 385/31; 385/33; 385/36; 385/39

(58) Field of Classification Search ......... 359/618–623, 359/626, 638–641, 495; 372/34, 36, 43.01, 372/50.11, 50.12, 68–71, 75, 93, 99, 101, 372/107–109; 385/27, 31, 33, 36, 39, 88; 235/462.35

See application file for complete search history.

(56) References Cited

U.S. PATENT DOCUMENTS

| 4,820,010 A | 4/1989 | Scifres et al. ............ 350/96.15 |
| 4,978,197 A | 12/1990 | Horikawa ................... 350/174 |
| 5,155,623 A | 10/1992 | Miller et al. ................. 359/495 |
| 5,617,492 A * | 4/1997 | Beach et al. .................. 385/33 |
| 5,784,203 A | 7/1998 | Beckmann ................... 359/618 |

(Continued)

FOREIGN PATENT DOCUMENTS

DE    200 10 309 U 1    6/2000

(Continued)

OTHER PUBLICATIONS

J.G. Endriz et al., "High Power Diode Laser Arrays," *IEEE Journal of Quantum Electronics*, vol. 28, No. 4, Apr. 1992, pp. 952-965.

*Primary Examiner*—Loha Ben
(74) *Attorney, Agent, or Firm*—Morrison & Foerster LLP

(57) ABSTRACT

Arrangements for combination and fast-axis alignment of fast-axes of diode-laser beams are disclosed. Alignment arrangements include providing each diode-laser with a corresponding alignable fast-axis collimating lens, providing individually alignable mirrors for steering an re-orienting beams from each diode-laser, and providing single diode-laser slab-modules in which the diode-laser beams can be pre-aligned to a common propagation-axis direction, and in which edges and surfaces of the slabs can be used to align the fast and slow-axes of the beams. Beam combination methods include combination by dichroic elements, polarization-sensitive elements, and optical fiber bundles.

18 Claims, 11 Drawing Sheets

U.S. PATENT DOCUMENTS

| | | | |
|---|---|---|---|
| 5,808,803 A | 9/1998 | Ullmann | 359/641 |
| 5,848,082 A | 12/1998 | Shum | 372/36 |
| 5,887,096 A | 3/1999 | Du et al. | 385/39 |
| 5,963,577 A | 10/1999 | Snyder et al. | 372/101 |
| 6,005,717 A | 12/1999 | Neuberger et al. | 359/619 |
| 6,044,096 A | 3/2000 | Wolak et al. | 372/36 |
| 6,064,528 A | 5/2000 | Simpson, Jr. | 359/619 |
| 6,072,815 A | 6/2000 | Peterson | 372/36 |
| 6,101,199 A * | 8/2000 | Wang et al. | 372/6 |
| 6,124,973 A * | 9/2000 | Du et al. | 359/618 |
| 6,151,168 A | 11/2000 | Goering et al. | 359/623 |
| 6,151,342 A | 11/2000 | Nightingale et al. | 372/36 |
| 6,229,831 B1 | 5/2001 | Nightingale et al. | 372/36 |
| 6,310,900 B1 | 10/2001 | Stephens et al. | 372/36 |
| 6,337,873 B1 | 1/2002 | Goering et al. | 372/69 |
| 6,356,577 B1 | 3/2002 | Miller | 372/107 |
| 6,411,323 B1 | 6/2002 | Waarts et al. | 347/241 |
| 6,556,352 B2 | 4/2003 | Wang et al. | 359/641 |
| 6,683,727 B1 | 1/2004 | Göring et al. | 359/639 |
| 6,853,490 B2 * | 2/2005 | Wang et al. | 359/621 |
| 6,993,059 B2 | 1/2006 | Anikitchev et al. | 372/106 |
| 7,006,549 B2 | 2/2006 | Anikitchev et al. | 372/97 |
| 7,010,194 B2 | 3/2006 | Anikitchev et al. | 385/36 |
| 7,044,653 B2 | 5/2006 | Reis | 385/88 |
| 7,136,408 B2 * | 11/2006 | Spinelli et al. | 372/70 |
| 7,230,968 B2 * | 6/2007 | Imai et al. | 372/101 |
| 7,408,970 B2 * | 8/2008 | Mefferd et al. | 372/70 |
| 7,443,895 B2 * | 10/2008 | Schulte et al. | 372/36 |
| 7,542,208 B2 * | 6/2009 | Gao et al. | 359/619 |
| 2003/0099267 A1 | 5/2003 | Hennig et al. | 372/36 |
| 2004/0091013 A1 | 5/2004 | Yamaguchi et al. | 372/108 |
| 2005/0063433 A1 | 3/2005 | Treusch et al. | 372/36 |
| 2006/0285571 A1 | 12/2006 | Sun et al. | 372/71 |

FOREIGN PATENT DOCUMENTS

| | | |
|---|---|---|
| DE | 101 13 019 A 1 | 3/2001 |
| EP | 0 984 312 A2 | 8/1999 |
| EP | 1 143 584 A2 | 10/2001 |
| JP | 2002-148562 | 5/2002 |
| JP | 2004-66543 | 3/2004 |
| WO | WO 03/098758 A1 | 11/2003 |

* cited by examiner

US 7,697,207 B2

HIGH POWER AND HIGH BRIGHTNESS DIODE-LASER ARRAY FOR MATERIAL PROCESSING APPLICATIONS

PRIORITY

This is a divisional application claiming priority to U.S. patent application Ser. No. 11/488,578, filed Jul. 18, 2006 now U.S. Pat. No. 7,515,346, which is hereby incorporated herein by reference.

TECHNICAL FIELD OF THE INVENTION

The present invention relates in general to arrays of diode-lasers. The invention relates in particular to diode-laser arrays arranged such that either individual diode-lasers or beams from individual diode-lasers are aligned in the fast axis direction of the diode-lasers

DISCUSSION OF BACKGROUND ART

Diode-lasers (edge-emitting semiconductor-lasers) provide an efficient source of bright light. Electrical to optical efficiency can be as high as 50%. This high efficiency makes diode-lasers attractive as laser radiation sources for material processing applications and laser welding applications. An individual diode-laser typically has a length between about 1.0 and 1.5 mm. Light is emitted from an aperture that has a height of between about 1.0 micrometers ($\mu m$) and 2.0 $\mu m$ and a width depending on the output power required from the individual diode laser with the width being greater the greater the power required. This width can be as large as 200 $\mu m$. The height and width directions of the emitting aperture are usually termed the fast and slow axes, respectively, by practitioners of the art. The quality of a beam emitted from a diode-laser is high in the fast-axis direction but low in the slow-axis direction, with the slow-axis quality being lower the wider the aperture. Beam quality can be quantified in terms of a parameter known as the "etendue" of the beam. The etendue is a product of the cross-section area of a conical beam of light (perpendicular to the propagation direction) and the solid-angle subtended by the light. A high quality beam has a low etendue and a low quality beam has a high etendue. In any axis perpendicular to the direction of propagation it is possible to envisage the etendue as a product of a length and an angle, typically, in units of millimeter-milliradians. A term "Beam Quality Parameter" also measured in mm-milliradians is commonly used in the industry. This is proportional, but not necessarily equal to, the square root of the etendue. In a high-power diode-laser emitter, the etendue in the fast axis direction is low, and the etendue in the slow axis direction can be as great as two orders of magnitude higher. Etendue is an important parameter, because the etendue of an optical system never decreases. A perfect optical system produces an image with exactly the same etendue as a source being imaged.

An individual diode-laser typically does not emit sufficient power for the applications being considered here. When more power is required than one diode-laser can supply, it is usual commercial practice to provide a linear diode-laser array, commonly referred to as a diode-laser bar. In such an array, a plurality of diode-lasers (emitters) are formed on a single substrate (the "bar"). This provides that the emitting apertures of the emitters are aligned in the slow axis direction. The light from all of the emitters must be collected by an optical system of some kind and focused on material being cut or welded. This is a less-than-ideal arrangement, as the etendue of the diode laser bar in the slow-axis direction is the sum of the etendues of the individual emitters. Because of this an optical system for collecting and focusing the beams must deal with a combined beam that is highly asymmetrical. Such a system requires a complicated arrangement of cylindrical and spherical lens elements. Further, the emitters, being on a common substrate, must be connected electrically in parallel. This creates a requirement for a high-current power supply. The cost of such power supplies rises in proportion to the deliverable current.

U.S. Pat. No. 6,044,096 discloses a diode laser bar package in which a multifaceted optical element is used to receive beams from emitters in a diode-laser bar and rotate the transverse axes of the individual beams through 90 degrees such that the beams leave the element aligned one above the other in the fast-axis direction. In such an arrangement, it is the fast-axis etendues that are aligned. In theory, at least, beams from sufficient emitters can be combined in this way such that the sum of the fast-axis etendues of the beams is equal to the slow-axis etendue of an individual beam. This would produce a symmetrical combined beam that could be focused by a conventional lens. The optical element for rotating the beams, however, is exceedingly complex, as two reflective facets must be provided for each emitter. Such an element, if made from a thermally stable material, is not suitable for low cost construction or production in commercial volumes. Further, the arrangement still requires a high-current power supply for the parallel-connected emitters.

There is a continuing need for a diode-laser array capable of providing a combined beam power of at least about 100 W, and preferably 1 kilowatt (kW) or more, and a combined-beam etendue of between about 5 and 50 mm-mrad. Individual emitters in the array must be connectable in series to avoid the requirement for a high-current power supply, even if this requires a high-voltage power supply.

SUMMARY OF THE INVENTION

The present invention is directed to optical apparatus for combining beams from diode-lasers. In one aspect, apparatus in accordance with the present invention comprises a plurality of diode-laser assemblies. Each of the assemblies includes only one diode-laser. The diode-laser is arranged to emit a beam characterized as having fast-axis, a slow-axis perpendicular to the fast axis, and a propagation axis perpendicular to both the fast-axis and the slow axis. Each of the assemblies also includes a cylindrical lens arranged to collimate, in the fast axis direction, the beam emitted by the diode-laser. An arrangement, including the pre-alignable cylindrical lenses, is provided for aligning the beams from the diode-laser assemblies with the propagation axes of the beams parallel to each other and with fast-axes of the beams aligned in the fast-axis direction.

The term "pre-alignable" as applied to the cylindrical, fast-axis-collimating, lens, here means that the alignment of the lens in the assembly with respect to the diode-laser can be varied for steering the beam emitted by the diode-laser before being fixedly attached to the assembly. In a preferred implementation of such a pre-alignable lens the assembly includes a pad having a lens support member with a spherical surface attached thereto. One non-optical surface of the lens is held movably in contact with the spherical surface and manipulated to effect alignment of the lens with respect to the diode-laser. After the desired relative alignment has been obtained, the lens is fixedly attached to the spherical surface, to maintain the relative alignment.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1A:
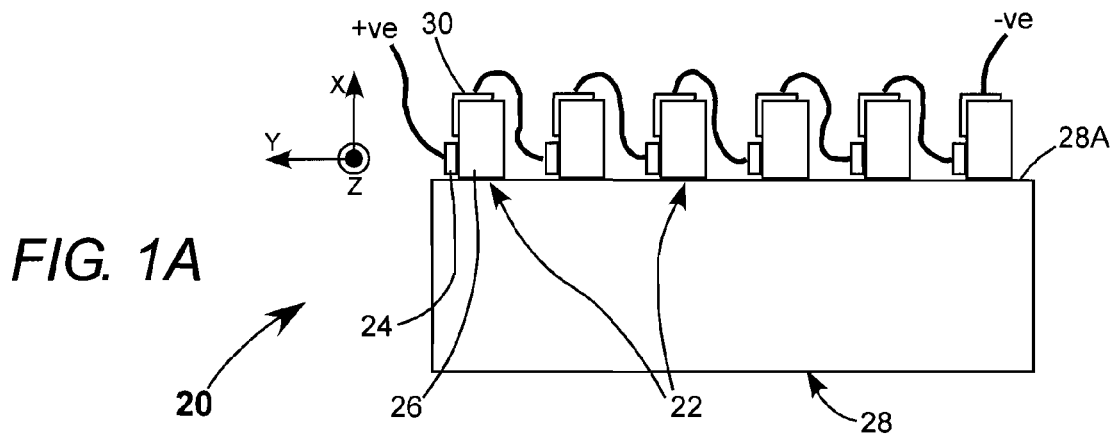
FIG. 1A is a side-elevation view schematically illustrating a diode-laser array package in accordance with the present invention, including a plurality of individual diode-lasers, each thereof mounted on an individual thermally-conductive sub-mount, with one side of each of the thermally conductive sub-mounts in thermal contact with a common heat-sink, the submounts being aligned on the heat-sink such that the diode-lasers are aligned in the fast axis direction, and such that beams emitted by the diode-lasers are parallel to each other.
Figure 1B:
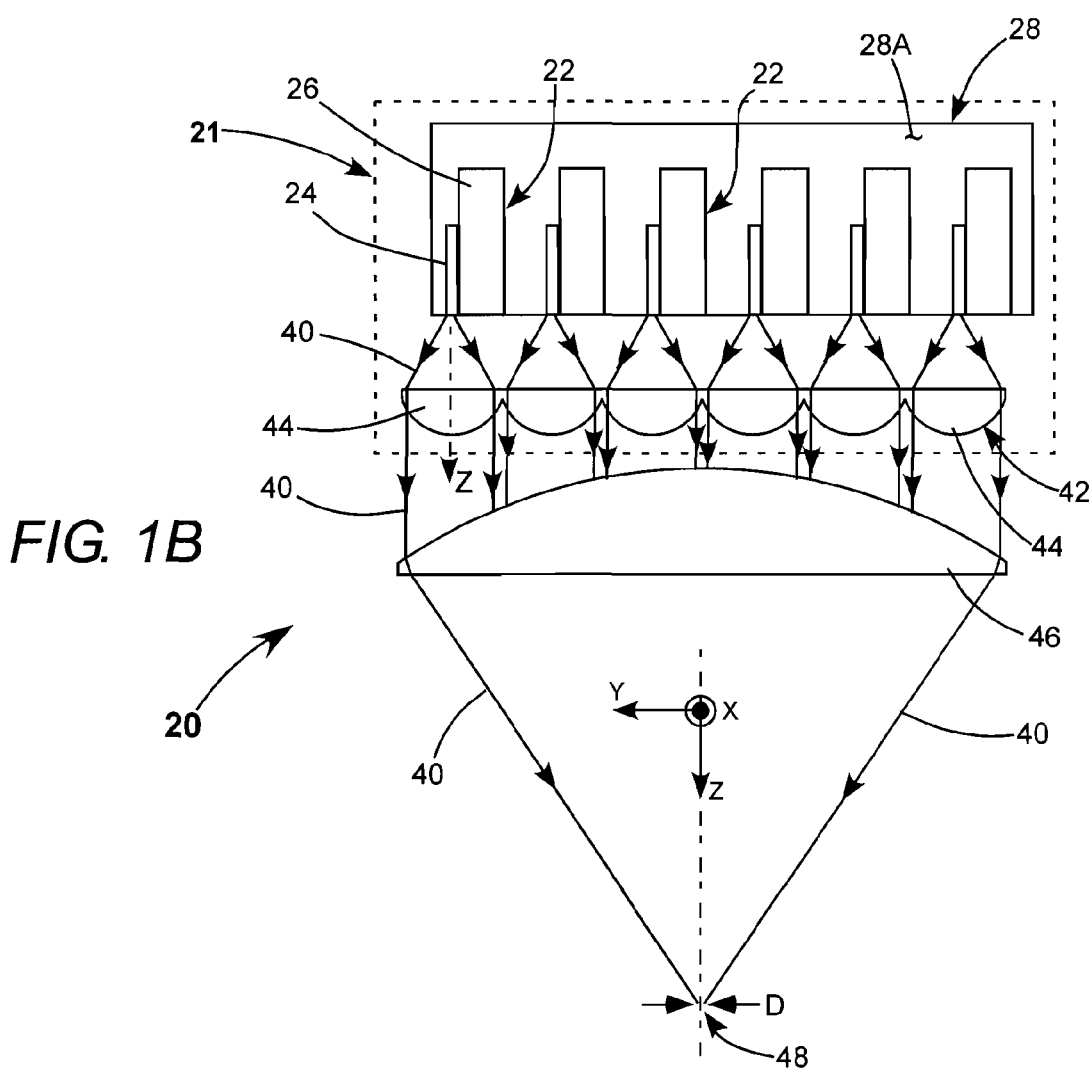
FIG. 1B is a plan view from above schematically illustrating further details of the package of FIG. 1A including a spherical lens for focusing the parallel beams into a focal spot.

Referring now to the drawings, wherein like components are designated by like reference numerals, FIG. 1A and FIG. 1B schematically illustrate one preferred embodiment 20 of a diode-laser array package in accordance with the present invention. Package 20 includes a plurality (here, six) of individual diode-laser assemblies 22. Each diode-laser assembly 22 includes a diode-laser 24 mounted on a thermally conductive, electrically insulating submount 26, preferably of diamond, by means of a solder bond. Each submount 26 is bonded to a surface 28A of common heat sink 28. Metallization 30 is provided on each submount to permit electrical contact to the base of the diode-laser. The diode-lasers are electrically connected in series with the upper, strip electrode (not explicitly shown) of one diode-laser being connected to the base of the next as indicated schematically in FIG. 1A.

As the diode-lasers are depicted in FIG. 1A, each diode-laser would emit a beam perpendicular to the plane of the drawing. The emitted beams represented by rays 40 are depicted in FIG. 1B with characteristic fast-axis divergence, typically between about 30° and 45°. In FIG. 1B, the slow-axis of the diode lasers is perpendicular to the plane of drawing. In the drawings of FIGS. 1A and 1B, the fast and slow-axes of the diode-lasers are designated the Y-axis and the X-axis, respectively, with the general direction of beam emission (the propagation axis) being designated as the Z-axis. The X, Y, and Z axes are mutually perpendicular. The diode-lasers are preferably equally spaced part in the Y-axis (fast-axis) direction.

A lens array 42 is located in front of the diode-lasers (in the emitting direction). Lens array 42 includes a plurality of cylindrical lenses 44 having positive optical power in the fast-axis, and zero optical power in the slow axis. There is one cylindrical lens 44 for each diode-laser, and the lenses 44 have a vertex-to-vertex spacing equal to the Y-axis spacing of the diode-lasers 24 with the optical axis (vertex) of each lens being aligned with the Z-axis of the corresponding diode-laser.

Beams 40 from the diode-lasers are intercepted by the lens array. The distance of the lens array from the diode-lasers and the focal length of lenses 44 is selected such that the beams from the diode-lasers are collimated in the fast-axis, and such that the collimated beams are almost contiguous in the fast-axis direction. The diode-lasers, sub-mounts, and heat-sink can be considered as an inventive sub-assembly which is outlined in phantom in FIG. 1B. This sub-assembly is useful in other embodiments of the present invention described further hereinbelow, and, accordingly is designated in FIG. 1B by general reference numeral 21.

The collimated beams are focused by a spherical lens 46 to form a focal spot 48. In theory at least, if the number of diode-lasers 24 in array 20 is selected such that sum of the fast-axis etendues of the diode-lasers is equal to the slow-axis etendue of one of the diode-lasers, then focal spot 40 will have about the same width D in the X and Y-axes. Set forth below are numerical examples of selected parameters for diode-lasers and optical elements in the inventive array of FIGS. 1A and 1B.

A typical, high-power diode-laser has an emitting-aperture width (often referred to as the stripe width) of about 100 um, and an output beam divergence angle of 40 degrees in the fast-axis (full width or FW) and 10 degrees in slow-axis FW. This means that at a wavelength of 980 nm, the emitted-beam mode-size in the fast-axis is about 1.7 μm FW. If the fast-axis spacing (pitch) of individual diode-lasers is 0.5 mm, and if the lenses 44 have a focal length f equal to about 0.7 mm and are spaced apart from the diode lasers by about this focal length, then the output of cylindrical lens array 42 is a contiguous parallel beam. By selecting a focal length F of the focusing lens 46 of about 41 mm, the 1.7 mm fast-axis mode-height will be focused into a focal spot width D of about 100.0 μm. The maximum number of emitters that can be arrayed in this manner, and, therefore, the output power in the focused beam, can be determined by the maximum numerical aperture of the focused beam (or its quality factor). This is summarized in TABLE 1, where it is assumed that the power of each emitter equal to 5.0 W, and the focused beam has a full-angle divergence Θ.

TABLE 1

| Output NA | Number of Emitters | Beam Quality Factor D*Θ/4 | Total Power |
|---|---|---|---|
| 0.15 | 25 | 7.5 mm-mrad | 125 W |
| 0.30 | 52 | 15.0 mm-mrad | 260 W |

In FIG. 1A and FIG. 1B, for convenience of illustration, only those optical elements are shown that are required to form fast axis rays 30 from the diode-lasers into a focal spot. In the above-described examples it is preferable that slow-axis optical elements be provided and arranged to image 1:1 the output of each individual emitter into focal spot 48. This would provide that focal spot had the same fast-axis and slow-axis widths. Optical arrangements for such slow-axis imaging are known in the art. By way of example, an additional cylindrical lens having a focal length of 41 mm in the slow-axis and zero power in the fast-axis could be inserted between cylindrical lens array 42 and spherical focusing lens 46. Alternatively, the focusing lens 46 could be replaced by a combination of two cylindrical lenses, or one lens with two cylindrical surfaces and with cylindrical axes of the surfaces oriented perpendicular to each other.

Figure 2:
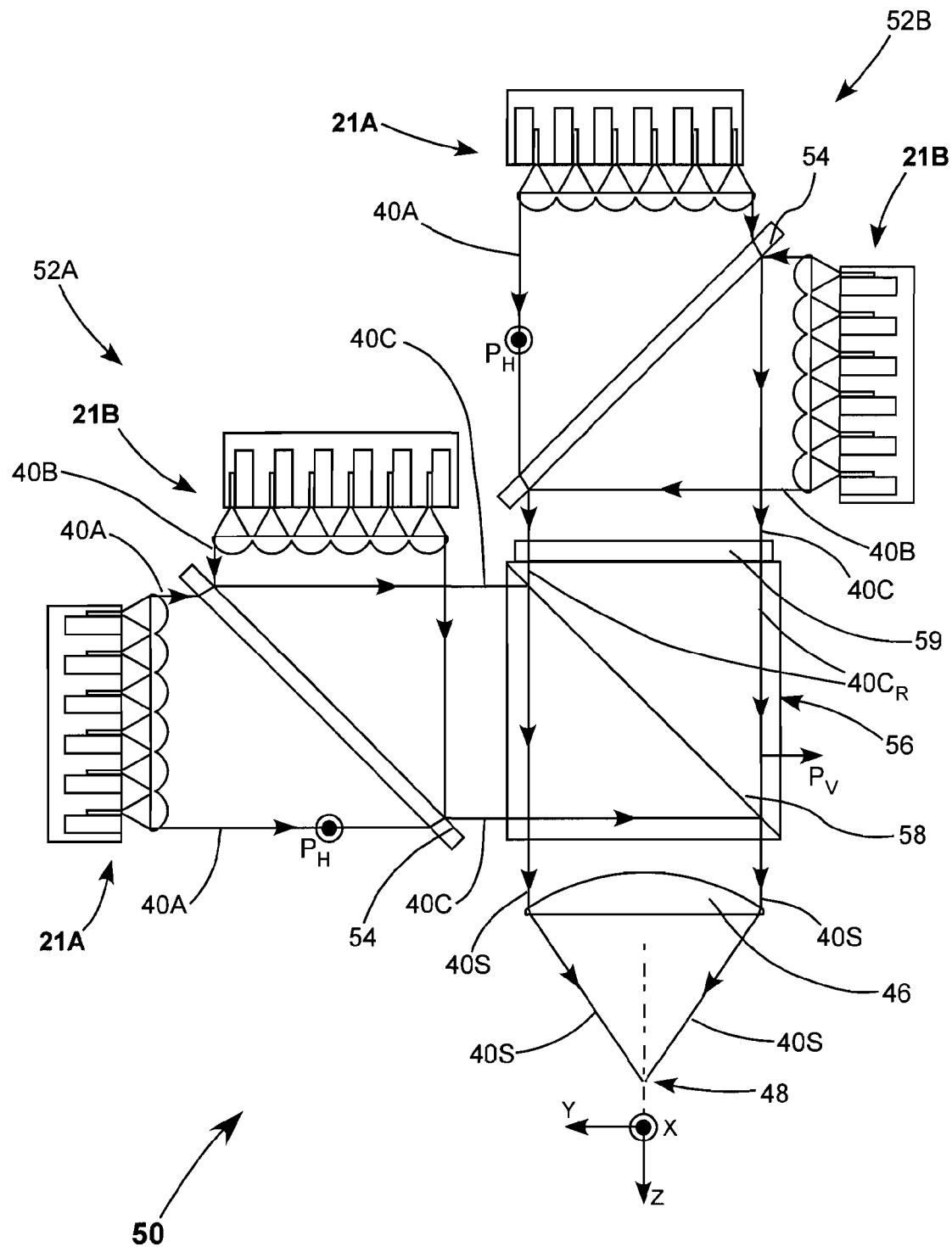
FIG. 2 schematically illustrates another preferred embodiment of a diode-laser array package in accordance with the present invention including four arrays configured in the manner of the array of FIG. 2 and arranged in two groups of two, with the arrays in each group emitting at different wavelengths, with beams emitted by the arrays in each group combined by a dichroic beam-combiner, with the combined beams from each group being combined by a polarization-sensitive beam-combiner, and with the combined combined-beams being focused by a spherical lens.

FIG. 2 schematically illustrates another preferred embodiment 50 of a diode-laser array package in accordance with the present invention. Package 50 includes four assemblies 21 as described above with reference to FIG. 2. These assemblies are arranged in two groups 52A and 52B each including two assemblies. In each group the diode-laser assemblies emit radiation at different wavelengths. This is indicated in FIG. 2 by designating one assembly as assembly 21A and the other as assembly 21B. Beams emitted by the assemblies are designated correspondingly by rays 40A and 40B respectively. Although the assemblies in each group are designated by the same reference numerals, it is not necessary that the two different wavelengths emitted by each group be the same.

The different wavelength rays from each group are combined on a common path by arranging the emitting directions of the two assemblies therein perpendicular to each other and arranging a wavelength selective beam combiner 54 at an angle of 45° to the two emitting directions. Combiner 54 transmits rays 40A and reflects rays 40B. The combined beams are designated in FIG. 2 by rays 40C. Preferably the wavelengths in each group should be as close as possible to each other while still being sufficiently different that they can be efficiently combined by combiner 54. By way of example the wavelengths are preferably between about 5 nm and 50 nm of each other.

Beams emitted by wide-strip (wide emitting aperture) diode-lasers are usually plane polarized, with the polarization plane usually being oriented parallel to the slow axis of the diode-lasers (TE-polarized lasers). Lasers with output polarized perpendicular to the slow-axis (TM-polarized lasers) are also available, but are much less common than TE polarized lasers. The TE polarization orientation is designated in FIG. 2 by arrowhead $P_H$. Groups 52 are arranged such that the combined beams from dichroic beam combiners 54 thereof propagate perpendicular to each other and are incident on a polarization-sensitive beam combiner 56. The combiner, here is a MacNielle biprism type combiner with an internal combining surface 58 at an angle of 45° to the propagation direction of the combined beams in the bi-prism. Surface 58 is arranged to reflect plane-polarized radiation having a polarization plane oriented perpendicular to the plane of incidence of the radiation on the surface (s-polarized radiation) and to transmit plane-polarized radiation having a polarization plane oriented parallel to the plane of incidence of the radiation on the surface (p-polarized radiation). Rays 40 C from group 52A are reflected from surface 58 of the beamsplitter. A polarization rotator 59 is placed in the path of combined beam 40C from group 52A. Here, the polarization rotator is depicted as being mounted on a face of the bi-prism. The polarization rotator is configured to rotate the plane of polarization of combined beams by 90° as indicated by arrow $P_V$. One reason why the two wavelengths emitted by each group should be as close as possible to each other is because polarization rotation by such a polarization rotator is wavelength sensitive. The polarization-rotated combined beam is designated by rays 40C$_R$. Polarization orientation P$_V$ is parallel to the plane of incidence of the beam on surface 58, allowing the p-polarized combined beam 40C$_R$ to be transmitted and combined on a common path with reflected s-polarized beam 40. The summed (combined) combined-beams are designated in FIG. 2 by rays 40S. Rays 40S are focused by focusing lens 46 to a focal spot 48 as described above with reference to FIG. 1B.

In an alternative arrangement of package 50 (not shown), the entire assembly 52B can be rotated by 90° thereby rotating the polarization plane of beam 40C therefrom by 90°. In such an arrangement, polarization rotator 59 is not necessary. Accordingly, the wavelengths of the diode-lasers in assemblies 52A and 52B may be more widely spaced that is possible in package 50 of FIG. 2. As the optical outputs 40C of assemblies 52A and 52B are about symmetrical in X and Y this alternative arrangement does not lead to an increase in total etendue.

A benefit of combining beams in this way is that the etendue of the summed combined beams is the same as the total etendue of the beams from any assembly 21. This provides that the summed combined beam has 4-times greater power but the same beam quality as that from any individual assembly. TABLE 2 indicates exemplary performance parameters of a package 50 in cases where the individual assemblies 21 have the parameters tabulated in TABLE 1.

TABLE 2

| Output NA | Beam Quality Factor D*Θ/4 | Total Power |
|---|---|---|
| 0.15 | 7.5 mm-mrad | 500 W |
| 0.30 | 15.0 mm-mrad | 1040 W |

Figure 2A:
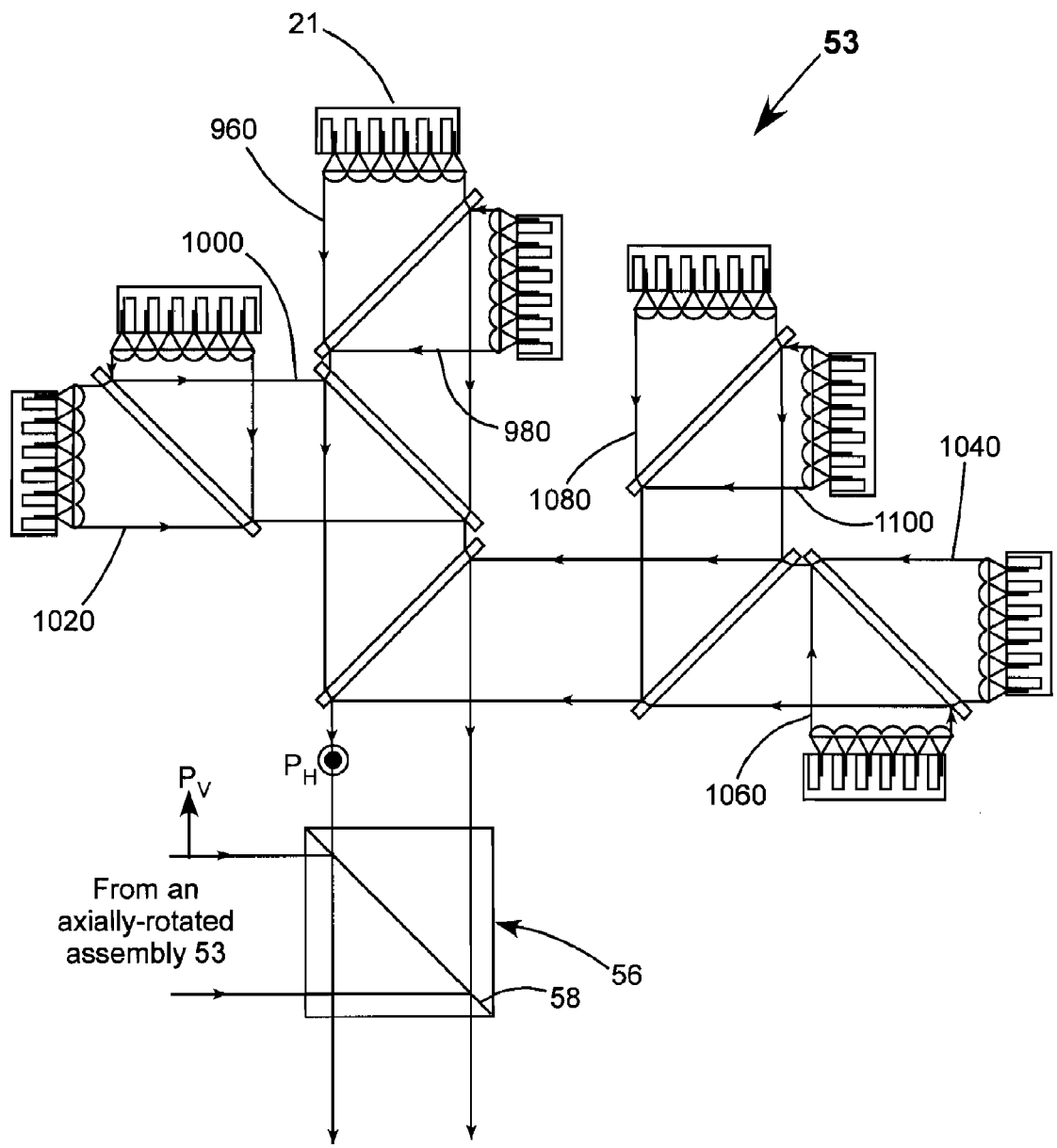
FIG. 2A schematically illustrates an embodiment of the present invention similar to the embodiment of FIG. 2 but wherein there are two groups of eight diode-laser arrays (only one thereof illustrated) with outputs of the arrays combined dichroically and with outputs from each group combined by a polarization-sensitive beam-combiner.

It is possible to combine multiple packages 21 into a package such as package 52. Assuming, for example, wavelength increments of 20 nm between assemblies 21, it is possible to "fit" eight assemblies 21 into a spectral range from 960 nm to 1100 nm (this a spectral range where efficiency of diode lasers is at a maximum). Beams from four pairs of packages 21 could be combined dichroically, in a reverse tree manner using seven dichroic combiners. By way of example the eight packages may emit at 960 nm, 980 nm, 1000 nm, 1020 nm, 1040 nm, 1060 nm, 1080 nm, and 1100 nm. One example of combining the beams is depicted in FIG. 2A wherein a package 53 including eight packages 21 is schematically depicted. The beams are designated by reference numerals corresponding to the wavelength of the beams. The output of package 53 has a polarization orientation P$_H$ is combined by a polarization-sensitive combiner 56 with the output of a similar assembly 53 (not shown) that has been axially rotated to rotate the plane of polarization thereof to an orientation P$_V$. Dichroic mirrors having a high reflection to high transmission width of less than 20 nm are readily available commercially. Polarization combiners having an effective bandwidth greater than 200 nm are also readily available commercially.

Those skilled in the art will recognize with further illustration or detailed description that in embodiments of the present invention discussed above wherein dichroic combination is effected by wavelength selective mirrors, the dichroic combination may be effected by a prism, a conventional diffraction grating, or a volume Bragg grating without departing from the spirit and scope of the present invention. In this type of combination, the output of five or more different-wavelength diode-lasers may be combined by a single device.

It is also possible to combine the output of a number of packages 50 by an optical fiber coupling arrangement. Such an arrangement is described below with reference to FIG. 3.

Figures 3, 3A:
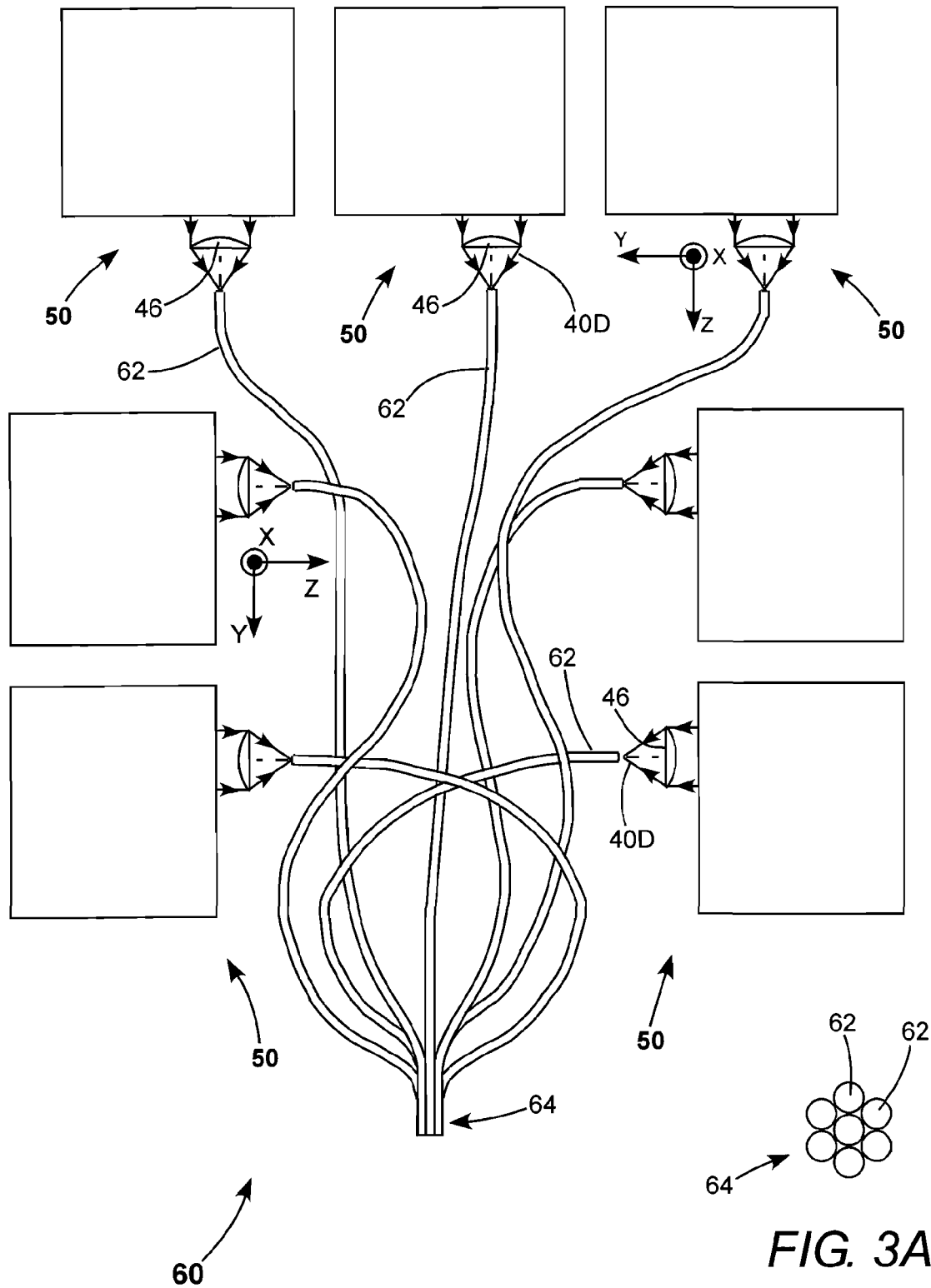
FIG. 3 schematically illustrates a preferred arrangement of apparatus in accordance with the present invention wherein the output of seven diode-laser array packages having the arrangement of the package of FIG. 2 is focused into proximal ends of a corresponding seven optical fibers, with distal ends of the fibers being formed into a close packed bundle.

FIG. 3 depicts apparatus 60, comprising a plurality (here, seven) of above-described packages 50 and an equal plurality of optical fibers 62. Lens 46 of each package 50 focuses the output of the package into a proximal end of a corresponding optical fiber 62. Distal ends of the fibers are packed into a bundle 64 thereof (see detail in FIG. 3A). In this particular packing, the etendue of the packed bundle will be about seven times the etendue of any one package. The beam quality factor will be about 2.7 times that of any one package. The power delivered by the packed bundle will be seven times the power of an individual package 50. TABLE 3 indicates exemplary performance parameters of an example of apparatus 60, wherein packages 50 have the parameters tabulated in TABLE 2.

TABLE 3

| Output NA | Beam Quality Factor D*Θ/4 | Total Power |
|---|---|---|
| 0.15 | 22 mm-mrad | 3.5 kW |
| 0.30 | 44 mm-mrad | 7.3 kW |

It should be noted here that while packages 50 are depicted in FIG. 3 with Y and Z-axes thereof in the same plane, i.e., the plane of the drawing, this is merely for convenience of illustration and is not necessary for proper functioning of the apparatus. The focal spots at the entrance faces of the fibers are preferably symmetrical. Any asymmetry of the focal spots will increase the etendue.

Those skilled in the art will recognize that while assemblies 21 in above-described packages and apparatus in accordance with the present invention avoid the need for a complex multifaceted optical element, such as that discussed in the background section above with reference to the '096 patent, careful alignment of diode-lasers on sub-mounts, and alignment of sub-mounts on the heat sink is needed to ensure that beams emitted by the diode-lasers are parallel to each other and aligned in the fast axis. The time required for this will vary, depending, inter alia, on the skill of a person carrying out the assembly, and the number of diode-lasers being assembled. It is possible, however, that micromanipulation tooling could be developed to assist in such alignment and reduce the time involved.

Set forth below is a description of embodiments of diode-laser array packages in accordance with the present invention which can achieve fast-axis alignment of a plurality of diode-laser beams with the aid of a plurality of individually alignable plane mirrors. These embodiments are designed to make use of commercially available, optical elements, commercially available individual diode-lasers, and commercially available micro-assembly tooling.

FIG. 4A, FIG. 4B, FIG. 4C and FIG. 5 schematically illustrate yet another embodiment 80 of a diode-laser array package in accordance with the present invention. Package 80 includes four individual diode-laser packages or sub-packages 82A, 82B, 82C and 82D. Each sub-package 82 includes one diode-laser 84 mounted on a heat sink 86. The sub-packages 82 are mounted on a surface 104 of a base 102, which is preferably water cooled or conductively cooled. The heat sinks of the sub-package are mounted on the base via a thermally conductive but electrically insulating layer 92 (see FIG. 4C). Layer 92 may be a diamond layer, or it can be simply an insulating coating. By way of example, base 102 can be of hard-anodized aluminum with the anodized layer on the base providing the insulation. The sub-packages 82 are arranged in two pairs 81A and 81B with the diode-lasers of each pair of sub-packages arranged face-to-face with the fast-axes thereof parallel to surface 104 of base 102. The sub-packages are further arranged with Z-axes of the diode-lasers parallel to each other but with the Z-axes in one pair opposed to the Z-axes in the other, i.e., with the emitting apertures (not shown) of the diode-lasers in pair 81A facing those in pair 81B. The packages are further arranged such that beams emitted by the diode-lasers are interleaved with adjacent beams traveling in opposite directions. In each sub-package there is a cylindrical lens 88 mounted on a ceramic pad 90. Cylindrical lens 88 is arranged to collimate light from the diode-laser in the fast-axis in the same manner as above-described lenses 40 in lens array 42.

Four 45-degree prisms 94 are mounted on surface 102 via a ball mount 100, set in a ceramic pad 98. Beam 40 from each of the diode-lasers is incident on a reflectively coated hypotenuse face 96 of a corresponding prism 94. The reflective coating on faces 96 is not shown in FIGS. 4A-C, but is depicted in FIG. 5 by cross-hatching on the faces. Faces 96 provide 45-degree mirrors reflecting beams 40 in a direction perpendicular to surface 104 of base 102. The prisms and the corresponding ball-mount provide a convenient way of aligning the mirror and the beams reflected thereby. This method is discussed in detail further hereinbelow. Sub-packages 82 are arranged on base 102 and mirrors 96 are aligned such that beams reflected from mirrors 96 propagate in a direction perpendicular to the base and are aligned with Y-axes of the individual beams aligned in the Y-axis direction as in embodiments of the present invention described above.

An advantage of package 80 is that face-to-face sub-packages 82 can be relatively generously spaced on base 82 which is helpful in dissipating heat generated by the diode lasers and conducted into the base via heat sinks. The face-to-face arrangement provides that the spacing of the diode-lasers in each sub-package pair is not determined by the thickness of the heat sinks. The face-to-face arrangement of the package pairs provides that the Y-axis spacing between the beams reflected from faces 96 of prisms can be arranged to be one-half of the spacing between diode-lasers in each pair. The smaller the Y-axis spacing between the reflected beams, the smaller and potentially less expensive will be the optical elements required to focus the aligned beams.

Figure 6:
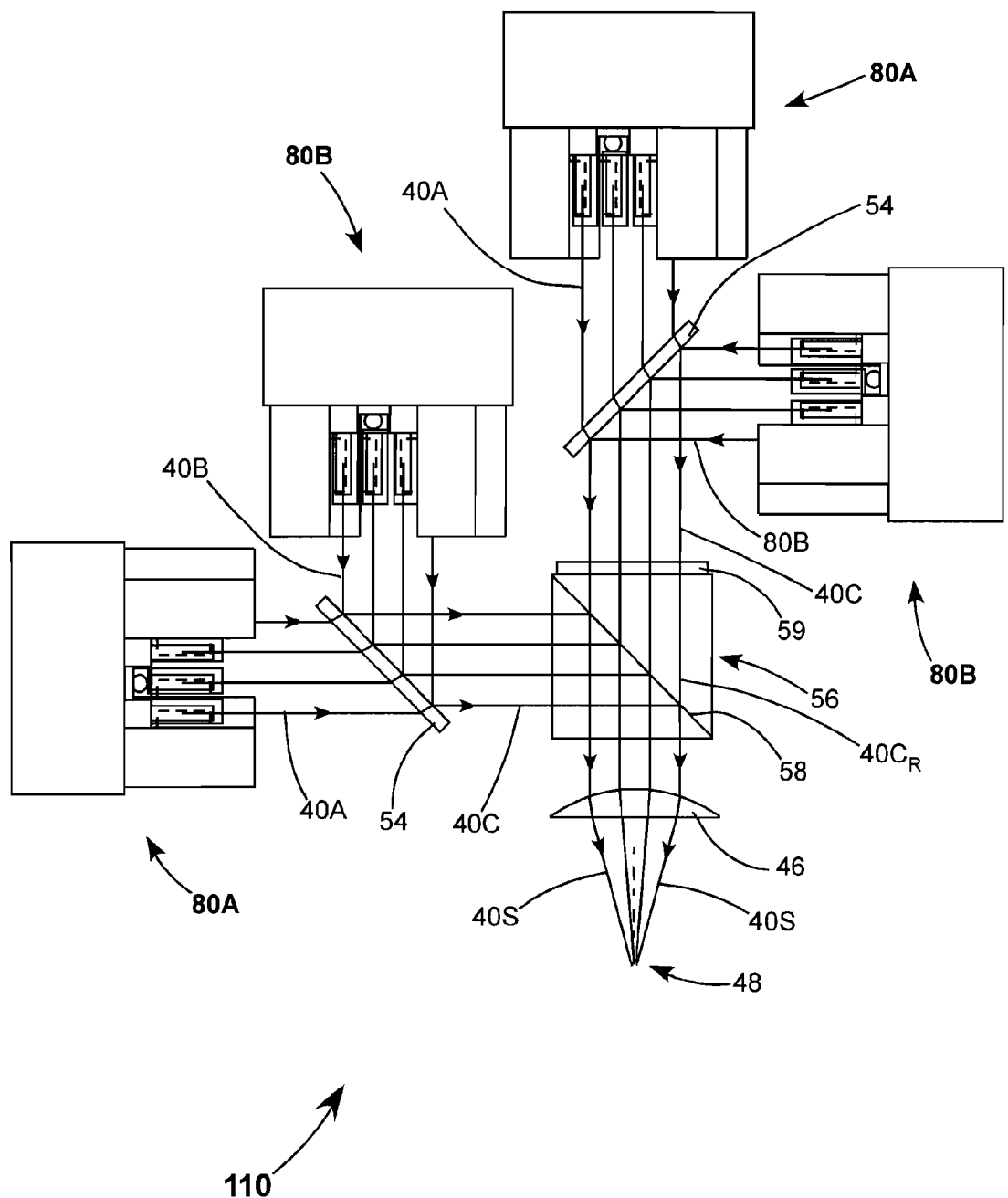
FIG. 6 schematically illustrates still another embodiment of a diode-laser array package in accordance with the present invention including four packages configured in the manner of the packages of FIGS. 4A-C and 5 and arranged in two groups of two, with the arrays in each group emitting at different wavelengths, with beams emitted by the arrays in each group combined by a dichroic beam-combiner, with the combined beams from each group being combined by a polarization-sensitive beam-combiner, and with the combined combined-beams being focused by a spherical lens.

Clearly, a disadvantage of package 80 is that less diode-lasers are included therein than would be required provide a set of aligned beams 40 having the same etendue in the X and Y-axes. This would result in a non-symmetrical focal spot and relatively low-power in a given etendue range for a free beam, or a beam in a fiber. Four or more packages 80 could be substituted for assemblies 21 in above-described package 50 with outputs from the packages being combined first by dichroic combination and then by polarization combination as discussed above. Such an arrangement is schematically depicted in FIG. 6 wherein apparatus 110 is similar to apparatus 50 but includes two pairs of packages 80 with packages in each pair thereof being designated 80A and 80B to indicate that the emission wavelengths of the packages are different. Combining elements and the manner in which beams are combined by those elements are the same as in package 50. Those skilled in the art will recognize without further illustration that the outputs 40S of a plurality of apparatuses 110 could be fiber-coupled into a fiber-bundle as described above with reference to apparatus 60 of FIG. 3.

It should be noted here that in package 80, a slow-axis collimating lens (SAC), is still required but is not shown in the drawings for convenience of illustration. By way of example, in the drawing of FIG. 6 such a lens could be located anywhere between assembly 80B and focusing lens 46. The exact location is set by the focal length of the SAC, which in turn depends on the required magnification ratio.

Figure 4B:
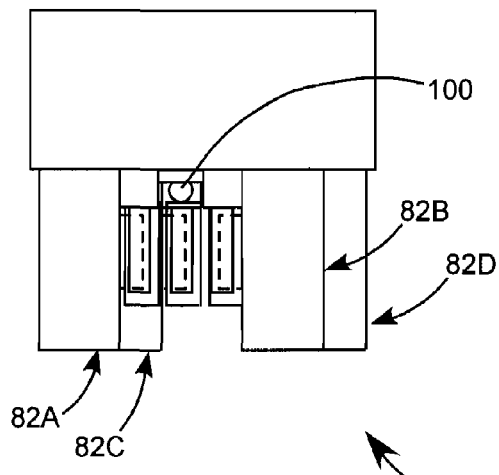
FIG. 4B is a rear-elevation view schematically illustrating further details of the package of FIG. 4A.
Figure 4A:
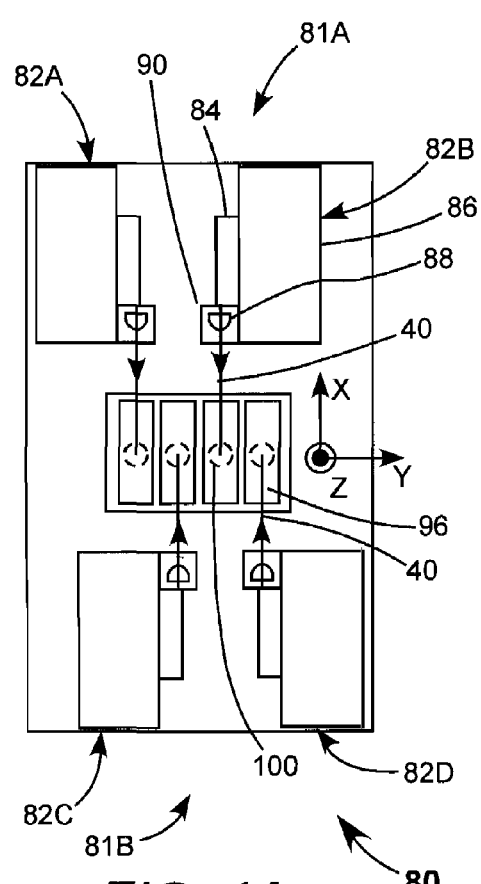
FIG. 4A is a plan view from above schematically illustrating yet another embodiment of a diode-laser array package in accordance with the present invention wherein four individual diode-laser packages, each including one diode-laser mounted on a heat sink, are mounted on a base in two pairs, with the diode-lasers in each pair arranged face-to-face and with the fast-axis parallel to the base, and wherein beams from the diode lasers are incident on a corresponding four 45-degree mirrors mounted on the base between the pairs of diode laser packages, with the beams being reflected in a direction perpendicular to the base with the fast axes of the beams aligned, and with the positioning of the pairs of packages being such that the fast-axis spacing between the reflected beams is about one-half of the spacing between the diode-lasers in the pairs of packages.
Figure 4C:
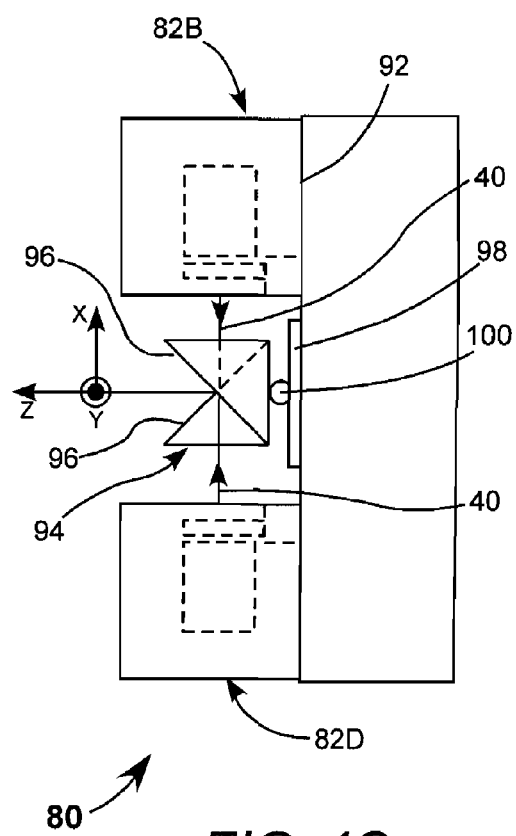
FIG. 4C is a right-hand-side elevation view schematically illustrating further detail of the package of FIG. 4A.
Figure 5:
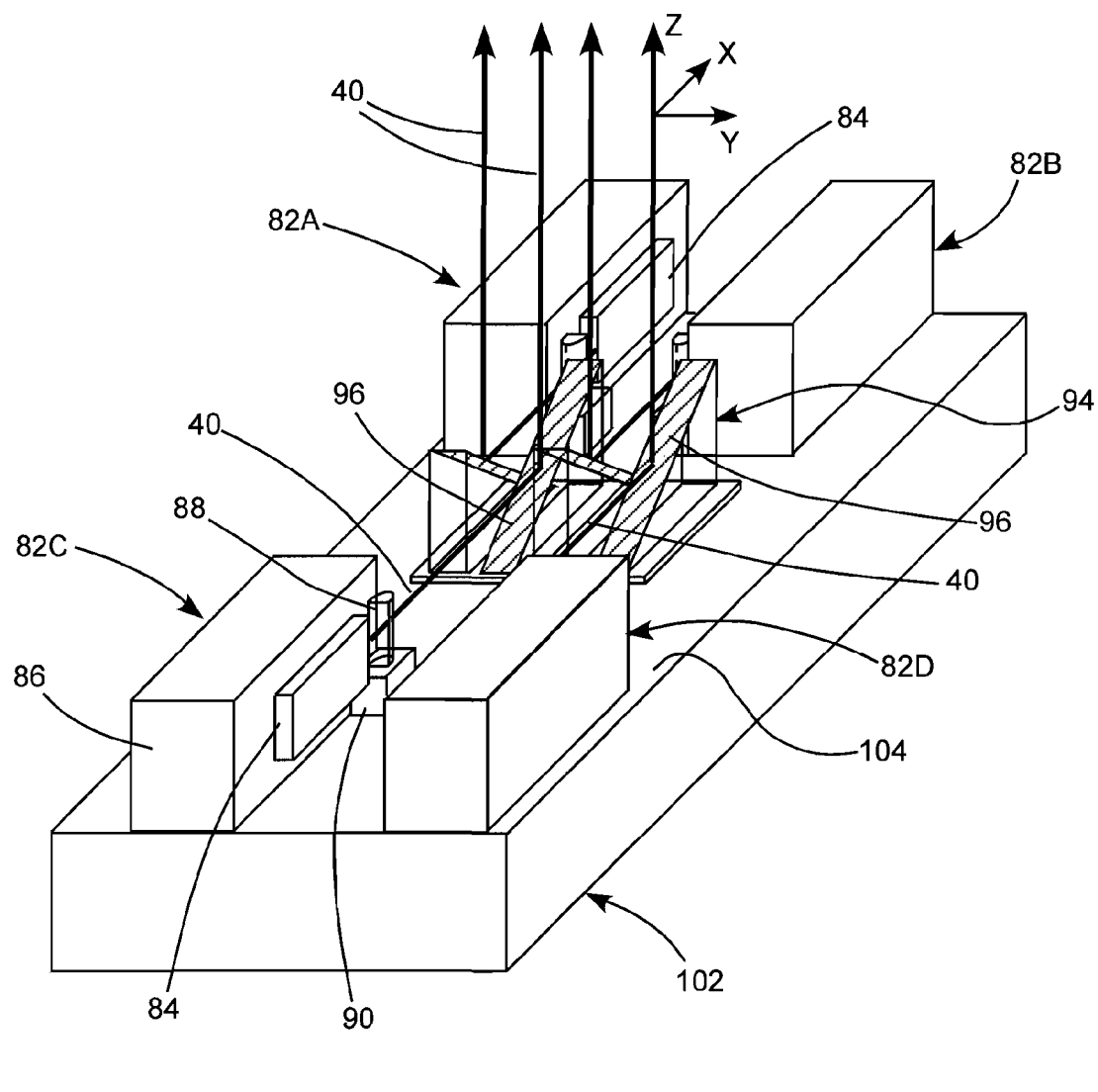
FIG. 5 is a three-dimensional view schematically illustrating further details of the package of FIG. 4.

Before describing another embodiment of a diode-laser array package in accordance with the present invention a description of a preferred optical component alignment method, mentioned above with reference to aligning reflective faces 96 of prisms 94 in apparatus 80 of FIGS. 4A-C is set forth below. Reference to these same drawings is made in the following description.

In this alignment method an optical component to be aligned, for example mirrored surface 96 of a prism 94 is held with an edge surface thereof in contact with an alignment ball 100 by micromanipulator tooling (not shown). The component, in this condition, can be moved in 5 out of 6 degrees of freedom of movement, lacking only translation in the vertical direction. The component is aligned using the tooling and an adhesive, such as epoxy, is injected into the space surrounding the point of contact of the component with the ball. Surface tension effects provide that adhesive distributes evenly around the ball, such that as the adhesive contracts on setting, stress is evenly distributed and the component remains in the aligned position after the tooling is removed.

Figure 7:
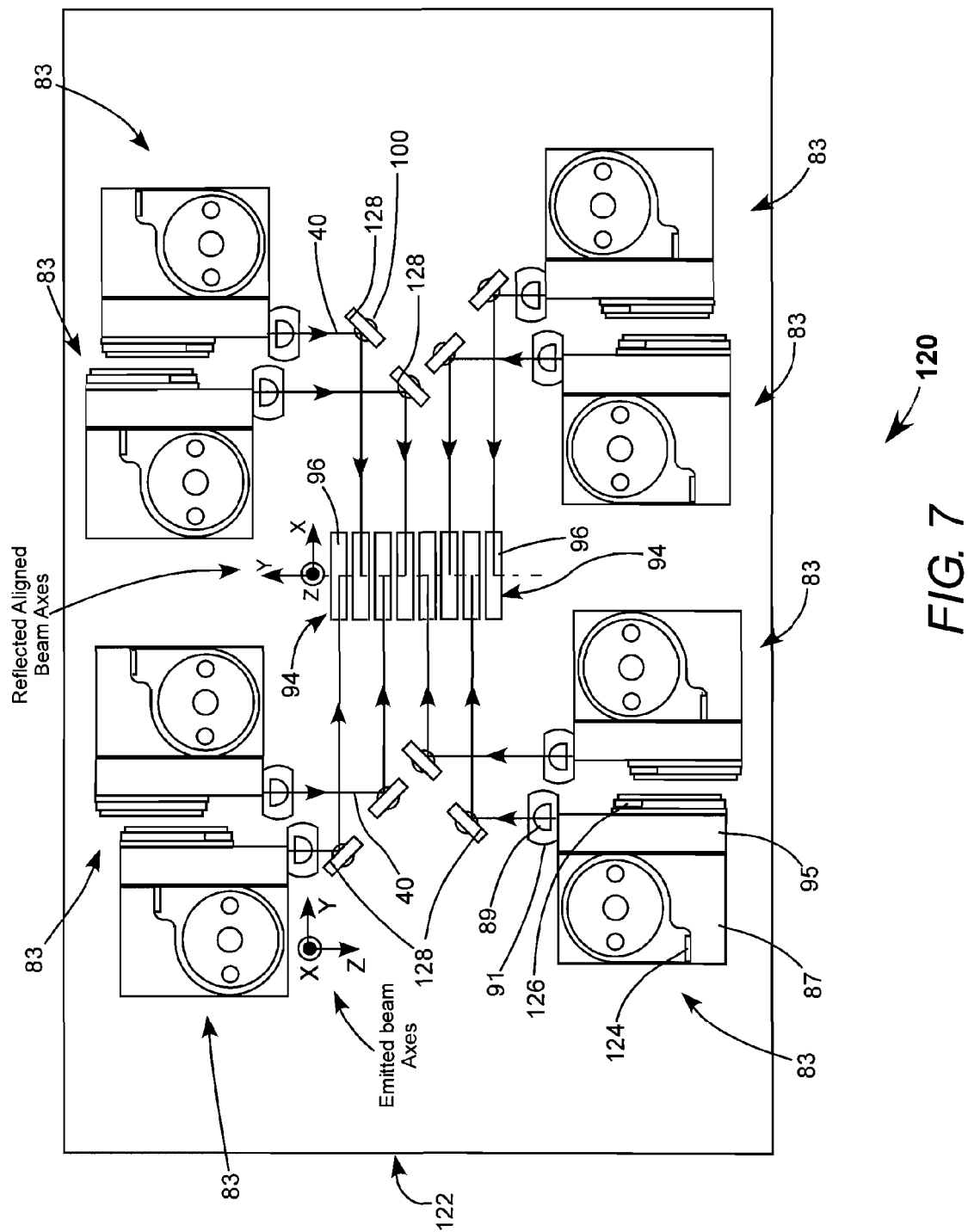
FIG. 7 is a plan view from above schematically illustrating a further embodiment of a diode-laser array package in accordance with the present invention, wherein eight individual diode-laser packages, each including one diode-laser mounted on a heat sink, are mounted on a base in four pairs, with the diode-lasers in each pair arranged face-to-face and with the fast-axis parallel to the base, and wherein beams from the diode lasers travel first parallel to the base and are incident on a first eight 45-degree mirrors that guide the beams onto a corresponding second eight four 45-degree mirrors mounted on the base between the pairs of diode laser packages, with the beams being reflected from the second eight mirrors in a direction perpendicular to the base with the fast axes of the beams aligned and the positioning of the pairs of packages and the mirrors being such that the fast-axis spacing between the perpendicularly-reflected beams is about one-half of the spacing between the diode-lasers in the pairs of packages.
Figures 8, 9:
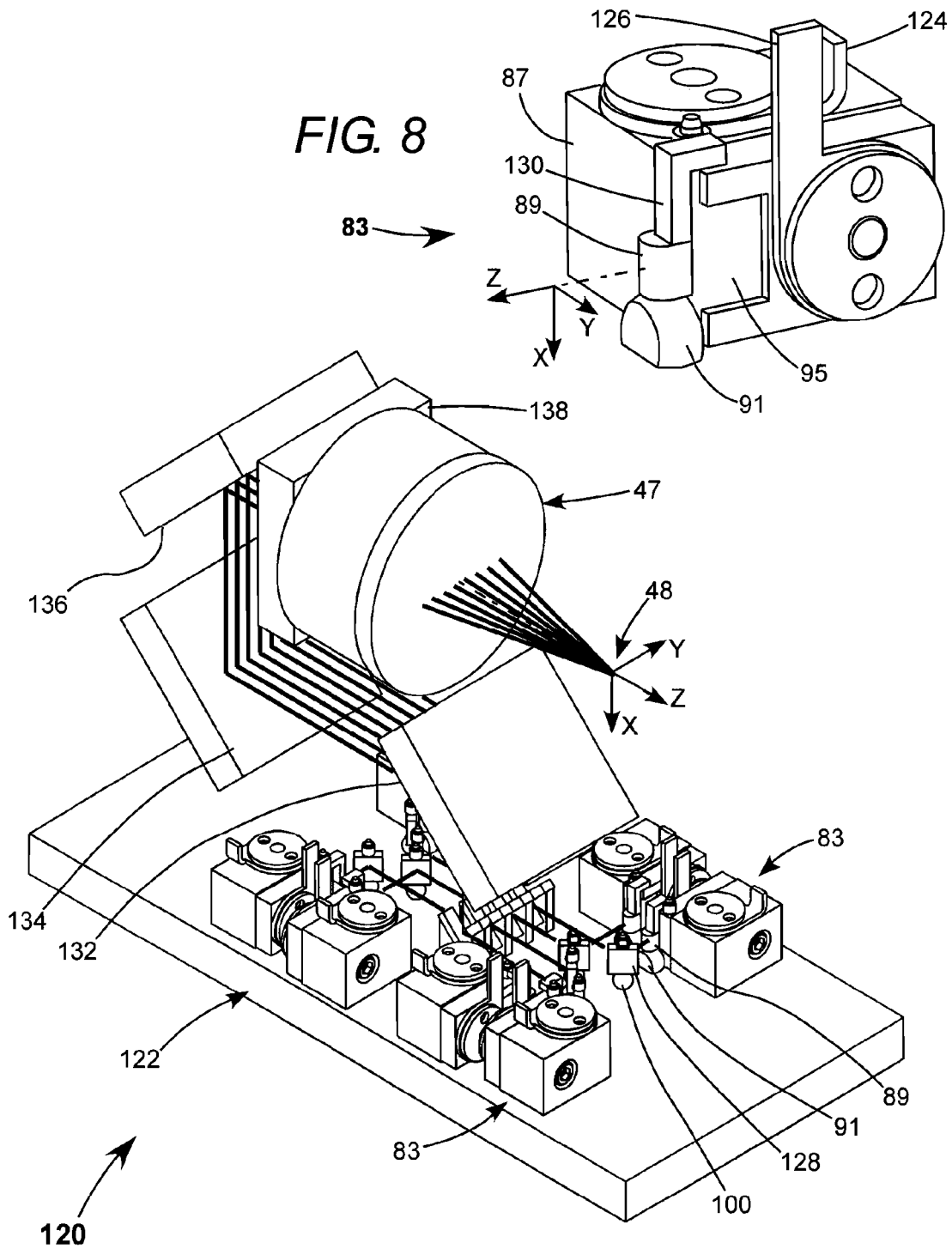
FIG. 8 is a three-dimensional view schematically illustrating details of an individual diode-laser package in the package of FIG. 7.
FIG. 9 is a three-dimensional view schematically illustrating further details of the package of FIG. 7 including an optical system for collecting and focusing the perpendicularly-reflected beams.

FIG. 7 is a plan view from above schematically illustrating a further embodiment 120 of a diode-laser array package in accordance with the present invention. FIG. 9 is a three-dimensional view schematically illustrating further details of the package. Package 120 includes eight individual diode-laser packages or sub-assemblies 83, details of which are illustrated in a three-dimensional representation in FIG. 8. Packages 83 as depicted here are DCP™-packages manufactured by Coherent, Inc. of Santa Clara, Calif. Each DCP includes one diode-laser 95 mounted on a heat sink 87. A cylindrical, fast-axis collimating lens 89 is located in front of the diode-laser. Lens 89 is mounted on a spherical ceramic or metal pad 91 which is bonded to heat sink 87. Lens 89 is aligned on pad 91 as described above. A bracket 130 attached to the lens is needed for the tool (such as vacuum chuck) to manipulate the leans during alignment. Electrical contact is made to the diode-laser via tabs 124 (positive) and 126 (negative).

Referring again to FIG. 7 and FIG. 9, DCPs 83 are mounted on a thermally conductive base 122, preferably a water cooled base. DCPs 83 are mounted on base 122 in four pairs, with the diode-lasers in each pair arranged face-to-face and with the fast-axes thereof parallel to the base. Each beam 40 from the diode-lasers travels first parallel to the base and is incident on a corresponding one of eight 45-degree mirrors 128. Mirrors 128 are alignable by the above discussed ball-mounting technique. Mirrors 128 direct beams 40 onto reflecting faces 96 of eight 45-degree prisms 94 configured and mounted as described above with reference to the four prisms to FIGS. 4A-C, with adjacent faces 96 facing each other. The beams are reflected from the reflecting faces in a direction perpendicular to base 122 with the fast-axes of the beams aligned in the fast-axis direction. The positioning of the pairs of DCPs and the mirrors is such that the fast-axis spacing between the perpendicularly-reflected beams is about one-half of the spacing between the diode-lasers in the pairs of DCPs. Referring in particular to FIG. 9, the perpendicularly reflected beams (depicted by bold lines) are reflected from 45-degree mirrors 132, 134, and 136 through a slow-axis collimating lens 138 and then through a two-element achromat focusing lens 47 that focuses the beams into focal spot 48.

Figure 10A:
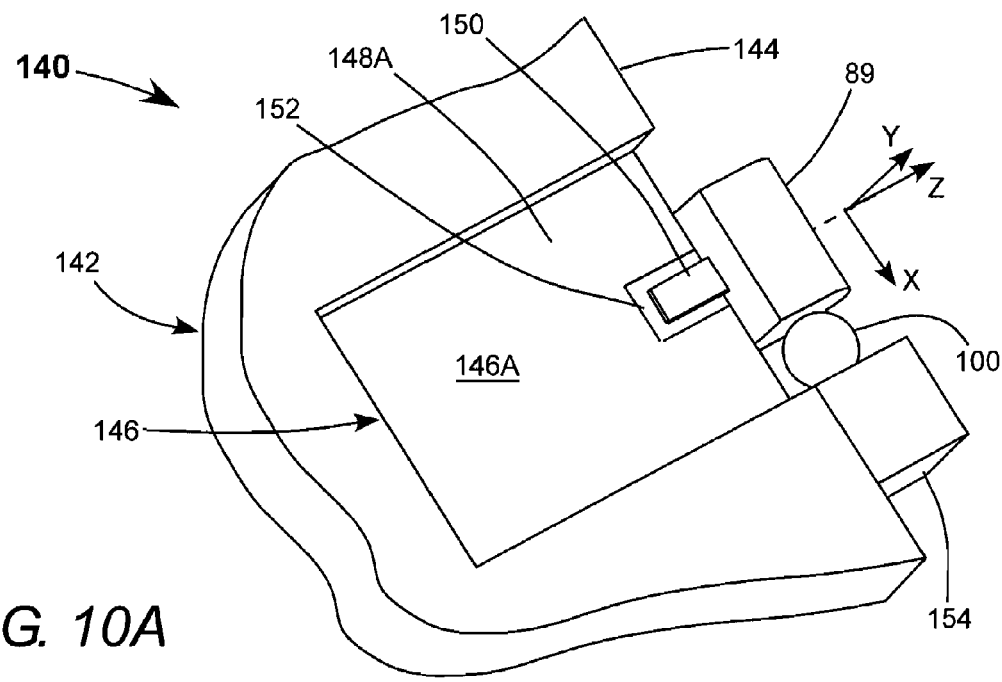
FIG. 10A and FIG. 10B are three-dimensional views from respectively above and below schematically illustrating a fast-axis stackable single-emitter diode-laser module in accordance with the present invention.
Figure 10B:
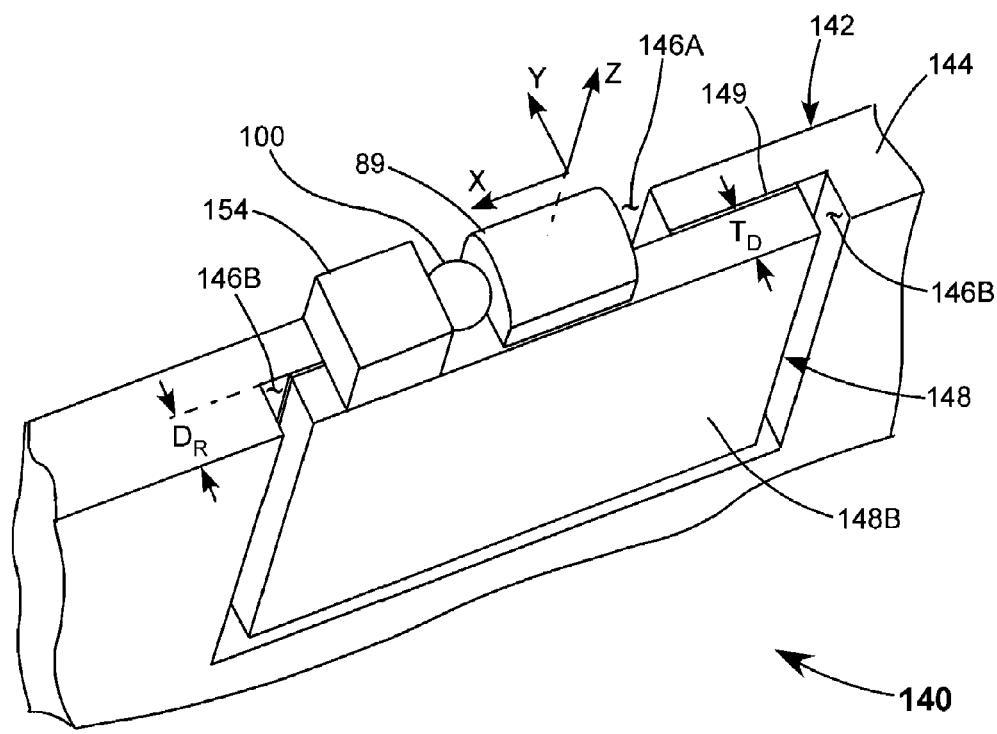

FIG. 10A and FIG. 10B are three-dimensional views from respectively above and below schematically illustrating one embodiment 140 in accordance with the present invention of a fast-axis stackable single-emitter diode-laser module. Module 140 includes a slab or base (only a fragment there illustrated) of a highly conductive metal, preferably copper. In a front edge of the slab is an open-fronted (open-sided) stepped cut-out region forming an upper portion (open-sided recess) 146A and a lower portion (open-sided recess) 146B. Lower portion 146B is longer and wider than upper portion 146A. In lower portion 146B of the cut-out region there is a substrate 148 of a highly conductive insulating material, preferably of crystal or synthetic diamond, bonded to slab 142, facing into and forming a floor of upper portion 146A. The bond of the substrate to the slab, here, is via a solder layer 149, although this bond may also be effected via a direct or optical contact. Diamond substrate 148 has a thickness $T_D$ that is less than the depth $D_R$ of slab lower portion 146B. In upper portion 146A single emitter diode-laser chip 150 is bonded to the diamond substrate via a metallized portion 152 of the substrate. Here again, the bond may be made using a solder or via a direct contact. The metallized portion 152 extends beyond the bounds of the emitter chip and permits electrical contact to be made to the base of emitter chip 150. A cylindrical, fast axis collimating lens 89 is located in front of emitter chip 150. Lens 158 is attached to an alignment ball 100, which, in turn is attached to a ceramic pad 154 bonded to front edge 144 of slab 142. This permits pre-alignment of the lens via the mounting technique discussed above in the context of other embodiments of the present invention.

The arrangement of module 140 permits that two or more such modules may be stacked by contacting the lower surface of slab 142 of one module with the upper surface of slab 142 of another module with the fast-axes of the emitters of the modules aligned in the fast-axis (Y-axis) direction. The modules can be clamped together such that thermal communication between the contact surfaces is optimized or may actually be bonded together using solder or the like.

Figure 11:
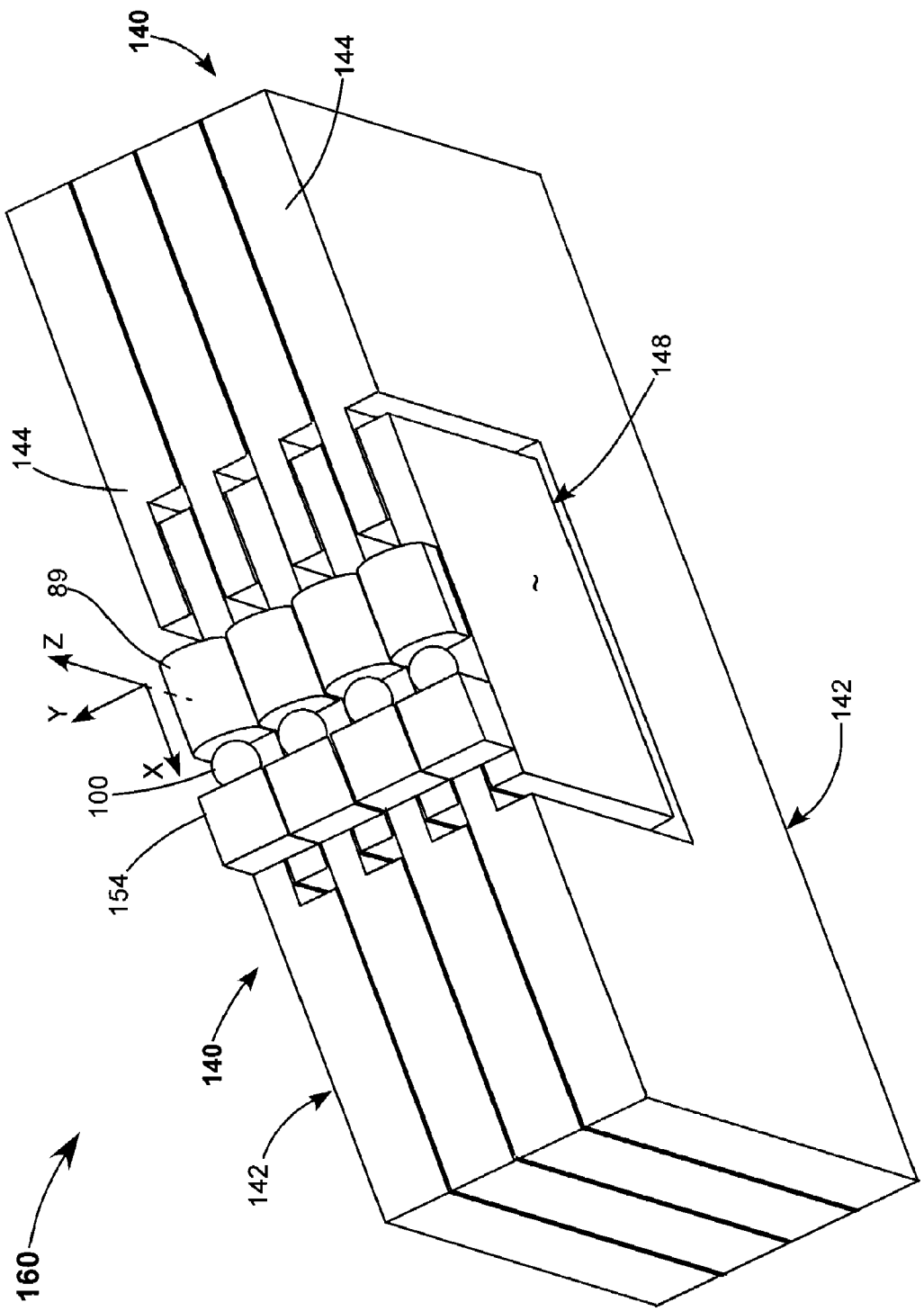
FIG. 11 is a three-dimensional view schematically illustrating a stack of four of the modules of FIGS. 10A and 10B.

FIG. 11 is a three-dimensional view schematically illustrating a stack 160 of four modules 140. The form of the modules permits that the emitter of a module can be operated before the modules are stacked. In one procedure for forming such a stack, lens 89 of each module is pre-aligned by operating the emitter to provide an emitted beam, manipulating lens 89 to align the emitted beam on a target, then fixing the position of the lens on ball 100. This provides that the Z-axis (propagation-axis) direction of each module to be stacked is the same. When the modules are stacked with front edges thereof aligned with each other the Z-axes and X-axes of the modules will be parallel to each other. Adjustment of the X-axis position of the slabs can be used to align the emitted beams in the Y axis dimension. Those skilled in the art may devise other stacking procedures for the inventive modules without departing from the spirit and scope of the present invention.

In summary embodiments of the present invention overcome problems with prior-art fast-axis stacking arrangements, such as the arrangement described in above discussed U.S. Pat. No. 6,044,096, wherein beams for a diode-laser bar are stacked by reflective surfaces of a complex multifaceted optical element. In this arrangement, a primary problem is due to a characteristic of diode-lasers bars whimsically referred to by practitioners of the art as "smile" of a typical bar. Here, "smile" is a misalignment of the slow-axes of emitters in a bar in the-fast axis direction and can be as much as ten micrometers or more along the 10 mm length of the bar. Historically smile has proved to be virtually impossible to eliminate. Even the best packaging procedures produce smile on the order of several μm. Effectively, it means that the fast-axis emitter-width is increased, thereby lowering the total brightness, i.e., increasing the total etendue, or beam-quality parameter.

Embodiments of the present invention described above provide a solution to the above-described problems by providing that emitters can be aligned individually to a corresponding fast-axis collimating or that individually alignable mirrors are provided for steering or re-orienting corresponding beams. In all but the embodiment of FIGS. 1A and 1B, individual diode-lasers can be turned on (operated) during a fine or even a coarse alignment stage, and, thus, provide for an interactive alignment procedure. This can be simply observing an individual beam on a target or measuring a property of a plurality of beams being aligned with each other, for example, the efficiency with which the beams can be coupled into an optical fiber.

Having un-bonded sub-mounts running is possible, for example, for effecting beam alignment in the embodiment of FIGS. 1 and 2. This, however, is a particularly cumbersome procedure.

In other embodiments discussed above, alignment procedures may appear to be complex and costly. This can be mitigated by automatic micro-alignment tooling procedures that presently exist or are presently being independently developed for certain applications. By way of example, the above discussed ball-mounting alignment technique for lenses and mirrors was developed by Iolon Inc of San Jose, Calif. As these techniques are further developed, the cost of the inventive packages can be reduced to a level that can be justified for many applications by the increased power and brightness obtained.

In conclusion, the present invention is described above in terms of a preferred and other embodiments. The invention is not limited, however, to the embodiments described and depicted. Rather, the invention is limited only by the claims appended hereto.

What is claimed is:

1. Optical apparatus, comprising:
   a metal heat sink; and
   a plurality of diode-laser assemblies, each of the assemblies including only one diode-laser and a thermally conductive electrically insulating sub-mount having first and second surfaces perpendicular to each other, the diode-laser characterized as having a fast-axis, a slow-axis perpendicular to the fast axis, and a propagation axis perpendicular to both the fast-axis and the slow axis, and being bonded to the first surface of the sub-mount; and
   wherein each of the diode-laser assemblies is bonded via the second surface of the sub-mount thereof to the heat sink with the propagation axes of the diode-lasers being about parallel to each other and with fast-axes of the diode-lasers aligned in the fast-axis direction.

2. The apparatus of claim 1, wherein the insulating sub-mounts are diamond sub-mounts.

3. The apparatus of claim 1, further including a lens arranged to focus beams from the diode-lasers into a common focal spot.

4. The apparatus of claim 1, wherein the diode-lasers are electrically connected in series with each other.

5. Optical apparatus, comprising:
   a plurality of pairs of diode-laser arrays, each diode-laser array including a plurality of diode-lasers, each diode-laser characterized as having a fast-axis, a slow-axis perpendicular to the fast axis, and a propagation axis perpendicular to both the fast-axis and the slow axis, with the diode-lasers in each of the arrays arranged, with propagation-axes thereof parallel to each other and with fast-axes of the diode-lasers aligned in the fast-axis direction, the diode-lasers in one array of each pair thereof having a different emitting wavelength from the diode-lasers in the other array of the pair, and the propagation axes of one diode-laser array in each pair being directed in a first direction, with the propagation axes of the other diode laser array in the pair being directed in a second direction at an angle to the first direction; and wherein a wavelength-sensitive optical element cooperative with each pair is arranged to combine beams from the diode-lasers in each array of the pair in a common direction.

6. The apparatus of claim 5, wherein the wavelength sensitive optical element is a dichroic filter reflective for the emitting wavelength of lasers in one diode-laser array of the pair and transmissive for the emitting wavelength of diode-lasers in the other diode-laser array of the pair and the common direction is one of the first and second directions.

7. The apparatus of claim 5, wherein there are two pairs of diode-laser arrays with the combined-beam common directions of each pair being at an angle to each other.

8. The apparatus of claim 7, wherein the combined beams from each of the pairs of arrays are plane-polarized parallel to each other, wherein the apparatus further includes a polarization rotator arranged to rotate the polarization plane of one of the combined beams perpendicular to the polarization plane of the other, and wherein a polarization-sensitive optical device is arranged to combine the combined beams from the diode-lasers in each array of the pair in a common direction.

9. The apparatus of claim 8, wherein the combined beam directions of the pairs of arrays are perpendicular to each other and the polarization-selective optical device is a polarizing beamsplitter cube.

10. The apparatus of claim 7, wherein the combined beams from each of the pairs of arrays are plane-polarized perpendicular to each other, wherein the apparatus further includes a polarization-sensitive optical device arranged to combine the combined beams from the diode-lasers in each array of the pair in a common direction.

11. The apparatus of claim 10, wherein the combined beam directions of the pairs of arrays are perpendicular to each other and the polarization-selective optical device is a polarizing beamsplitter cube.

12. Optical apparatus, comprising:
a plurality of diode-laser array packages;
each of the diode-laser array packages including a plurality of diode-laser arrays;
each of the diode-laser arrays including a heat sink and a plurality of diode-laser assemblies, each of the assemblies including only one diode-laser and a thermally conductive electrically insulating sub-mount having first and second surfaces perpendicular to each other, the diode-laser characterized as having a fast-axis, a slow-axis perpendicular to the fast axis, and a propagation axis perpendicular to both the fast-axis and the slow axis, and being bonded to the first surface of the sub-mount, with each of the diode-laser assemblies being bonded via the second surface of the sub-mount to the heat sink, with the propagation axes of the diode-lasers being parallel to each other and with fast-axes of the diode-lasers aligned in the fast-axis direction;
each of the diode-laser array packages including an optical arrangement for combining beams from the diode-laser arrays such that the combined beams propagate parallel to each other and aligned in the diode-laser fast axis direction; and each diode-laser array package having an optical focusing element and an optical fiber associated therewith, with the focusing element arranged to focus the combined beams from the package into a proximal end of the optical fiber, with distal ends of all of the optical fibers formed into a bundle.

13. The apparatus of claim 12, wherein there are seven diode-laser array packages and the bundle into which the distal ends of the optical fibers are formed is a hexagonal close-packed bundle.

14. Optical apparatus, comprising:
a thermally conductive metal base-plate having a mounting surface;
a plurality of individual diode-laser packages each thereof including only one diode-laser mounted on a heat sink, the packages being mounted on the mounting surface of the base-plate via a thermally conductive but electrically insulating layer, each diode-laser having an emitting aperture from which a beam of laser radiation is emitted;
the packages being arranged in pairs thereof with diode-lasers thereof arranged face-to-face and spaced apart with fast-axes of the diode-lasers parallel to the mounting surface of the base-plate, the packages being further arranged with propagation-axes of the diode-lasers parallel to each other, with the propagation-axes in one pair of packages opposed to the propagation-axes in the other, and interleaved such that beams emitted by the diode-lasers propagate about parallel to each other with adjacent ones thereof propagating in opposite directions with spacing between adjacent beams being less than the spacing between the diode-lasers in a pair of the packages;
a plurality of cylindrical lenses one thereof associated with each diode-laser, each cylindrical leans being arranged to collimate the beam emitted by the diode-laser in fast-axis direction thereof;
a plurality of mirrors mounted on the mounting surface of the base-plate each thereof associated with a corresponding one of the diode laser packages, the mirrors being arranged to reflect fast-axis collimated beams from the diode-lasers parallel to each other in the same direction perpendicular to the mounting surface of the base-plate with the fast-axes of the individual beams aligned in the fast-axis direction.

15. The apparatus of claim 14, wherein there are four diode-laser packages arranged in two pairs, with the diode-lasers in each pair about equally spaced part, wherein there are four mirrors, and wherein the spacing between the collimated, fast-axis-aligned beams reflected from the four mirrors, is about one-half of the spacing between diode-lasers in the pairs thereof.

16. Optical apparatus, comprising:
a thermally conductive metal base-plate having a mounting surface;
a plurality of individual diode-laser packages each thereof including only one diode-laser mounted on a heat sink, the packages being mounted on the mounting surface of the base-plate via a thermally conductive but electrically insulating layer, each diode-laser having an emitting aperture from which a beam of laser radiation is emitted;

the packages being arranged in first and second groups thereof with fast-axes of the diode-lasers parallel to the mounting surface of the base-plate;

first and second pluralities of mirrors mounted on the mounting surface of the base-plate, the first and second pluralities of mirrors being associated with respectively the first and second groups of diode-laser packages, the packages and mirrors in each group being arranged such that beams emitted from the diode-lasers and reflected from the mirrors propagate about parallel to each other and parallel to the mounting surface of the base-plate, with the beams in from the first and second groups of diode-laser packages propagating in opposite directions, and with any beam from the first group being adjacent a beam from the second group; and a further plurality of mirrors arranged to intercept the opposite-direction-propagating beams and reflect the beams such that the beams propagate in the same direction with the fast-axes of the beams aligned in the fast-axis direction.

17. The apparatus of claim 16, wherein there are eight diode-laser packages arranged in two groups of four diode-laser packages.

18. The apparatus of claim 16, wherein each diode-laser package includes a cylindrical lens arranged to collimate the beam emitted by the diode-laser before the beam is reflected from a mirror in the first plurality thereof.

* * * * *